United States Patent [19]

Graybill et al.

[11] Patent Number: 4,984,187

[45] Date of Patent: Jan. 8, 1991

[54] FIRST ORDER RECURSIVE DIGITAL FILTER WITHOUT MULTIPLIER

[75] Inventors: Mark Graybill, Moorpark; Allan Goetz, Reseda, both of Calif.

[73] Assignee: Hughes Aircraft Company, Los Angeles, Calif.

[21] Appl. No.: 813,180

[22] Filed: Dec. 24, 1985

[51] Int. Cl.[5] .............................................. G06F 7/38
[52] U.S. Cl. ................................................ 364/724.17
[58] Field of Search ................................... 364/724.01

[56] References Cited

U.S. PATENT DOCUMENTS 4,099,245  7/1978  Maysonett ............................ 364/724
4,104,729  8/1978  Gingell ................................. 364/724
4,356,558  10/1982  Owen et al. ......................... 364/724
4,573,135  2/1986  Dieterich ............................. 364/724

Primary Examiner—Gary V. Harkcom
Assistant Examiner—Long Thanh Nguyen
Attorney, Agent, or Firm—Randall M. Heald; Charles D. Brown; Wanda Denson-Low

[57] ABSTRACT

A recursive digital filter and method for filtering an n-bit digital input signal. The filter includes a summing circuit which receives an input signal. A second summing circuit is also provided which is coupled to the first summing circuit. Further provided is a feedback circuit which is operable to allow the first and second summing circuits to generate a filtered output signal without using a multiplier.

10 Claims, 2 Drawing Sheets

FIRST ORDER RECURSIVE DIGITAL FILTER WITHOUT MULTIPLIER

BACKGROUND OF THE INVENTION

1. Field of the Invention

The present invention relates to the field of digital signal filtering, and more particularly, to a first order recursive digital filter.

2. Description of Related Art

Digital filters are used for converting a sequence of numbers representing an input signal into another sequence of numbers representing an output signal. During this conversion process, the character of the input signal changes in some prescribed manner. Digital filters are generally linear and time-invariant, and can usually be fabricated from conventional digital hardware such as adders, multipliers and shift registers. Digital filtering can also involve a process in which a computer is used to generate a filtered output signal from a sampled input signal.

Digital filters are generally designed by selecting a desired transfer function and then implementing the transfer function using a variety of realization procedures. Depending on the realization procedure used, digital filters are often categorized as being either "recursive" or "non-recursive". The term "recursive" is used to describe filters which are generally realized by a circuit or a process in which the output of the filter is a function of a linear combination of the input signal as well as a prior input and a prior output signal. A filter is "non-recursive" when the filter is realized by a circuit or process in which the output signal is a linear function of only the past and present input signals. While filters realized in non-recursive form have good phase characteristics, such realizations often require a large number of components when compared to recursive implementations.

First order recursive digital filters are often realized by using canonical form representation. According to this realization, the output of the filter is delivered to a multiplier after passing through a delay element. The output of the multiplier is then delivered to an adder which sums the subsequent filter input signal with the multiplier output. Because multipliers are relatively slow, however, hardware or software implementation of these filters are often relatively inefficient in terms of speed. Further, the performance of such filters often decreases as the number of shifting operations increases. Multipliers are also often more expensive than other components such as adders, which tends to increase the relative cost of filters in which multipliers are used. Finally, there are some technologies, such as ECL and GaAs, in which effective multipliers do not currently exist. Although some non-recursive filters such as the one disclosed in U.S. Pat. No. 3,979,701 attempted to avoid using multipliers, they were not generally capable of direct implementation as recursive filters.

SUMMARY OF THE INVENTION

A recursive digital filter for filtering an n-bit digital input signal made in accordance with the present invention includes a summing circuit which receives the input signal. A second summing circuit is also provided which is coupled to the first summing circuit. Further provided is a feedback circuit which is operable to allow the first and second summing circuits to generate a filtered output signal without using a multiplier. While the filter may be implemented using hardware, filtering can also be achieved by using computer and software equivalents to the components described above.

BRIEF DESCRIPTION OF THE DRAWINGS

The various advantages of the present invention will become apparent to one skilled in the art upon reading the following specification and by reference to the drawings in which.

DESCRIPTION OF THE PREFERRED EMBODIMENT

Figure 1:
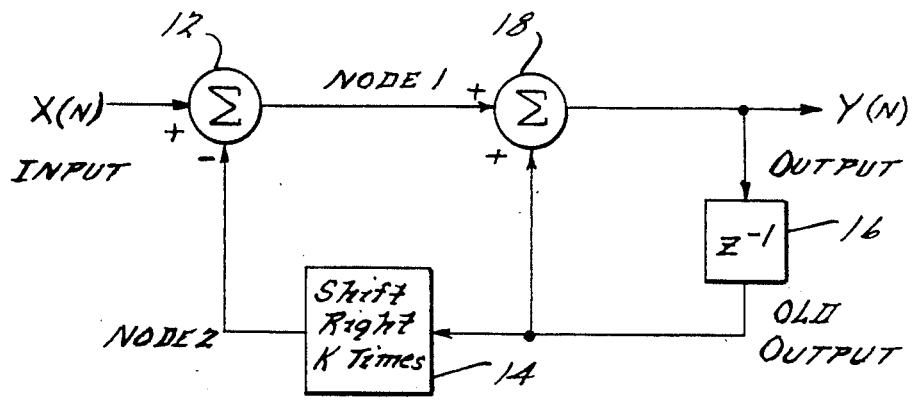
FIG. 1 is a diagrammatic illustration of the first order recursive digital filter of the present invention.

Referring to FIG. 1, to filter an n-bit digital input signal X(n), a first order recursive digital filter 10 is provided having a first binary adder 12. The adder 12 may comprise an arithmetic logic unit of a microprocessor, though other suitable devices may be used. The adder 12 serves to subtract from the input signal X(n) a shift signal generated by a shifter 14 thereby generating an intermediate signal used for later processing. The shifter 14 is used to shift the value contained in each bit position of the signal received by the shifter 14 to the next least significant bit position (i.e., shifts to the "right") k-times. Because the numerator and denominator of the filter's transfer function are both exponentially dependent on the number of shifting operations, the performance characteristics of the filter may be improved by increasing the value of k. The maximum value of k may be limited by the number of bits used and the phase lag of the system. While the shifter 14 may comprise a plurality of wired electrical interconnections between the components of the filter, it will be understood that other suitable means for shifting can also be used.

To generate an input signal for the shifter 14, a delay element 16 is provided. The delay element 16 receives the output signal Y(n) from the filter 10 and delivers a multibit delayed signal to the shifter 14 after a one clock cycle delay. While the delay element 16 may comprise a shift register, it is to be understood that other suitable means for receiving the output signal Y(n) and delaying the delivery of the output signal Y(n) to the shifter 14 may be used.

Summing the output of the first binary adder 12 with the output of the delay element 16 is a second binary adder 18. The second adder 18 may comprise an arithmetic unit of a microprocessor, though other suitable devices may be used. The second adder 18 serves to add the output of the first adder 12 with the output of the delay element 16 to generate the output signal Y(n). By arranging the first and second adders 12 and 18 in this manner, the shifter 14 and the delay element 16 allow the filter 10 to operate according to the following transfer function H(z) which is mapped into the z-plane:

$$H(z) = \frac{Y(z)}{X(z)} = \frac{z}{z - b}$$

-continued $$\text{where } b = \frac{2^k - 1}{2^k}$$

It will therefore be seen that the filter 10 provides a first order recursive filter which is realizable without using a multiplier. The fact that the value of b in the above equation approaches unity as the number of bit positions shifted increases allows the performance of the filter to increase as the value of k increases. This can be seen theoretically by noting that the limit of H(z) as K approaches infinity:

$$\lim_{K \to \infty} H(z) = \frac{z}{z-1}$$

This result indicates that the location of the pole asymptotically approaches the unit circle in the Z-plane for increasing k. This is desirable from the standpoint of maximum rejection, which is shown as:

$$\frac{\left|1 - \frac{(2^k - 1)}{2^k}\right|}{\left|1 + \frac{(2^k - 1)}{2^k}\right|} = \frac{1}{|2^{k+1} - 1|}$$

and $$\lim_{K \to \infty} \frac{1}{|2^{k+1} - 1|} = 0$$

The DC gain of the filter may be found by letting $z=1$ which yields a gain of $2_k$ as follows:

$$\frac{1}{1 - \frac{(2^k - 1)}{2^k}} = 2^k$$

One of the desirable aspects of this form is that the generation of multiplication by 1/b can be accomplished by an arithmetic shift right. The practical limit on the size of k is the number of bits to be used and the maximum allowable phase lag in the system. Because the multiplier is absent in this realization, digital signals can also be processed more efficiently in terms of processing time. In addition, since circuits fabricated using digital adders are often less expensive than circuits fabricated using digital multipliers, the relative cost of implementing a first order digital filter using the realization of the present invention is reduced.

Figure 2:
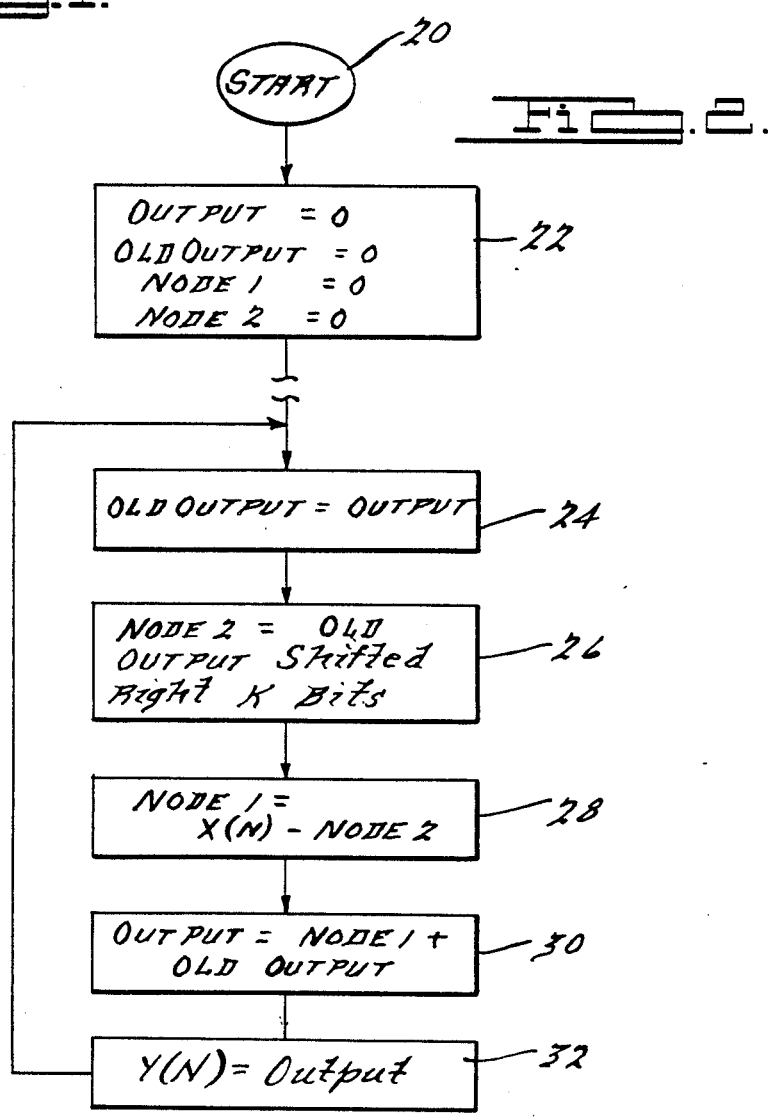
FIG. 2 is a portion of a flowchart for use in programming a computer to filter digital signals according to the present invention.

While the filter may be implemented using the hardware described above, digital filtering can be performed by using a computer. The method of filtering digital signals using a computer involves the steps shown in FIG. 2. After the start operation has been performed at step 20, the OUTPUT, OLD OUTPUT, NODE 1, and NODE 2 variables are initialized to zero at step 22. As is shown in FIG. 1, the NODE 1 variable corresponds to the intermediate signal produced by the adder 12 and delivered to the adder 18, while the NODE 2 variable corresponds to the shift signal produced by the shifter 14. In addition, the OUTPUT variable corresponds to the output signal Y(n), and the OLD OUTPUT signal corresponds to the signal generated by the delay element 16. The value of OLD OUTPUT is then equated with the value of OUTPUT at step 24, and then the value of NODE 2 is equated with the value of OLD OUTPUT shifted right k-bits at step 26. At step 28, the value of NODE 1 is equated with the value of NODE 2 subtracted from the input signal X(n). The value of OUTPUT, which corresponds to the filtered output signal, is then equated with the value of NODE 1 plus the value of OLD OUTPUT at step 30. After the value of OUTPUT is equated with the value of Y(n) at step 32, the steps 24–32 are repeated for the next sampled input signal X(n).

Figure 3:
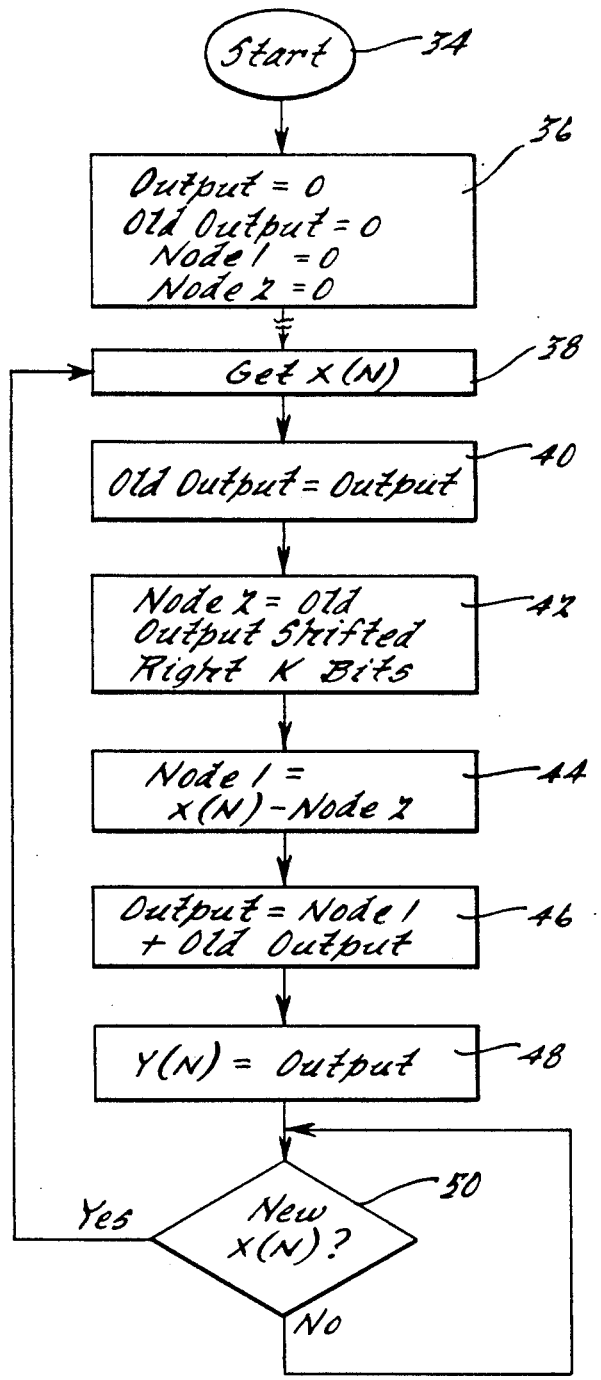
FIG. 3 is a portion of a flowchart for use in programming a computer to filter digital signals according to an alternative embodiment of the present invention.

An alternative embodiment for filtering according to the present invention using a computer is shown in FIG. 3. After the start-up operation has been performed at step 34, the OUTPUT, OLD OUTPUT, NODE 1, and NODE 2 variables are initialized to zero at step 36. The valve of X(n) is then read for filtering at step 38. The value of OLD OUTPUT is then equated with the value of OUTPUT at step 40, and the value of NODE 2 is equated with the value of OLD OUTPUT shifted right k-bits at step 42. At step 44, the value NODE 1 is equated with the value NODE 2 subtracted from the input signal X(n). The value of OUTPUT, which corresponds to the filtered output signal, is then equated with the value of NODE 1 plus the value of OLD OUTPUT at step 46. After the value OUTPUT is equated with Y(n) at step 48, the decision step 50 is encountered. If a new input signal X(n) is to be filtered, the processing returns to step 38 so that a new input signal X(n) can be read. If a new input signal X(n) is not to be filtered, the step 50 is reexecuted until a new input signal X(n) is to be filtered.

It should be understood that while the invention was described in connection with a particular example, other modifications will become apparent to those skilled in the art upon a study of the specification, drawings and following claims.

What is claimed is:

1. A recursive digital filter for filtering an N-bit digital input signal to generate a filtered output signal, said filter comprising:
   a first binary adder having a first input and first output, said first input for receiving said N-bit digital input signal said first binary adder generating a first output signal which is provided at said first output;
   a second binary adder having a first input coupled to said first output of said first binary adder said second binary adder having a first output; and
   means for providing feedback to said first and second binary adders, said means for providing feedback having a third input coupled to said first output of said second binary adder and generating a first feedback signal which is provided to a second input of said first binary adder and generating a second feedback signal which is provided to a second input of said second binary adder for generating said filtered output signal at said first output of said second binary adder.

2. The recursive digital filter of claim 1, wherein said first binary adder subtracts said first feedback signal from said digital input signal.

3. The recursive digital filter of claim 2, wherein said second binary adder adds said second feedback signal to the first input of said second binary adder.

4. The recursive digital filter of claim 1, wherein said means for providing feedback comprises means for generating a delayed signal from said filtered output signal and for delivering said delayed signal to said second binary adder.

5. The recursive digital filter of claim 4, wherein said filtered output signal is delivered to said second input of said second binary adder after a one clock cycle delay.

6. The recursive digital filter of claim 4, wherein said means for providing feedback further comprises a means for shifting said delayed signal, said means for shifting causing the bit contained in each bit position of said delayed signal to be shifted to the next least significant bit position a predetermined number of times, said means for shifting delivering said delayed and shifted signal to said first binary adder.

7. The recursive digital filter of claim 6, wherein said means for shifting comprises a plurality of wired electrical interconnections for generating said shifted signal, said plurality of wired electrical interconnections electrically disposed between said means for generating a delayed signal and said first binary adder.

8. The recursive digital filter of claim 6, wherein said filter has a transfer function which approaches a unit circle in the z-plane as the number of bit positions shifted by said means for shifting increases.

9. The recursive digital filter of claim 8, wherein said transfer function is represented by the following equation:

$$H(z) = \frac{z}{z - b}$$

where $$b = \frac{2^k - 1}{2^k}$$

$k$ = number of bit positions shifted by said means for shifting.

10. The recursive digital filter of claim 1, wherein each of said first and second summation means comprises an arithmetic logic unit of a microprocessor.

* * * * *